(12) United States Patent
de la Llera et al.

(10) Patent No.: US 9,111,731 B2
(45) Date of Patent: Aug. 18, 2015

(54) GAS FEED INSERT IN A PLASMA PROCESSING CHAMBER AND METHODS THEREFOR

(75) Inventors: Anthony de la Llera, Fremont, CA (US); Michael C. Kellogg, Oakland, CA (US); Alexei Marakhtanov, Albany, CA (US); Rajinder Dhindsa, Pleasanton, CA (US)

(73) Assignee: Lam Research Corporation, Fremont, CA (US)

( * ) Notice: Subject to any disclaimer, the term of this patent is extended or adjusted under 35 U.S.C. 154(b) by 414 days.

(21) Appl. No.: 13/616,571

(22) Filed: Sep. 14, 2012

(65) Prior Publication Data

US 2013/0134138 A1   May 30, 2013

Related U.S. Application Data

(60) Provisional application No. 61/564,514, filed on Nov. 29, 2011.

(51) Int. Cl.
*B23K 10/00* (2006.01)
*H01J 37/32* (2006.01)

(52) U.S. Cl.
CPC ........ *H01J 37/3244* (2013.01); *Y10T 29/49002* (2015.01)

(58) Field of Classification Search
CPC ........... H01J 37/3244; C23C 16/45565; C23C 16/06; C23C 16/02; H01L 21/306; H01L 21/67103; C23F 1/00; H05H 1/30; H05H 1/34; H05H 1/46; H05H 1/48
USPC ......... 219/121.4, 121.43, 121.54; 118/723 R, 118/723 E, 723 MP; 156/345.33, 345.34, 156/345.38, 345.43
See application file for complete search history.

(56) References Cited

U.S. PATENT DOCUMENTS

| | | | |
|---|---|---|---|
| 5,542,559 A | 8/1996 | Kawakami et al. | |
| 6,068,703 A | 5/2000 | Chen et al. | |
| 6,500,299 B1 | 12/2002 | Mett et al. | |
| 7,622,017 B2 | 11/2009 | Himori et al. | |
| 2004/0261712 A1 | 12/2004 | Hayashi et al. | |
| 2007/0210034 A1 | 9/2007 | Mather et al. | |
| 2008/0141941 A1* | 6/2008 | Augustino et al. | 118/723 R |
| 2009/0255631 A1* | 10/2009 | Sato | 156/345.43 |
| 2010/0230387 A1* | 9/2010 | Okesaku et al. | 216/69 |

OTHER PUBLICATIONS

"International Search Report", PCT Application No. PCT/US 12/65212, Mailing Date: Feb. 28, 2013.
"Written Opinion", PCT Application No. PCT/US 12/65212, Mailing Date: Feb. 28, 2013.

* cited by examiner

*Primary Examiner* — Mark Paschall
(74) *Attorney, Agent, or Firm* — Beyer Law Group LLP

(57) ABSTRACT

A gas feed insert configured to be disposed in a passage through an electrode assembly comprising a first insert end having therein a first bore aligned parallel with a linear axis of the gas feed insert. The gas feed insert further includes a second insert end opposite the first insert end, the second insert end having therein a second bore aligned parallel with the linear axis of the gas feed insert and a bore-to-bore communication channel in gas flow communication with the first bore and the second bore. The bore-to-bore communication channel is formed in an outer surface of the gas feed insert so as to prevent a line-of-sight when a gas flows from the first insert end through the bore-to-bore communication to the second insert end.

21 Claims, 3 Drawing Sheets

GAS FEED INSERT IN A PLASMA PROCESSING CHAMBER AND METHODS THEREFOR

PRIORITY CLAIM

This application claims priority under 35 USC. 119(e) to a commonly-owned provisional patent application entitled "Gas Feed Insert In A Plasma Processing Chamber And Methods Therefor", U.S. Application No. 61/564,514, filed on Nov. 29, 2011 by Anthony de la Llera et al., all of which are incorporated herein by reference.

BACKGROUND OF THE INVENTION

Plasma has long been employed for processing substrates (e.g., wafers, flat panel displays, liquid crystal displays, etc.) into electronic devices (e.g., integrated circuit dies) for incorporation into a variety of electronic products (e.g., smart phones, computers, etc.).

In plasma processing, a plasma processing system having one or more plasma processing chambers may be employed to process one or more substrates. Plasma generation may employ capacitively coupled plasma, inductively coupled plasma, electron-cyclotron technology, microwave technology, etc.

In an example capacitively coupled plasma processing chamber, the wafer may be disposed on a work piece holder, also known as a chuck. Generally speaking, the chuck functions as a lower electrode, which may be supplied with one or more radio frequency (RF) signals. Another electrode, known as the upper electrode, may be disposed in a spaced-apart relationship above the substrate. The gap between the substrate upper surface and the lower surface of the upper electrode typically forms a plasma generation region. In the typical scenario, the upper substrate is typically grounded, and the RF energy provided to the lower electrode is capacitively coupled to the plasma during substrate processing. That is, when reactant gases are released into the plasma generation region through gas feed tubes built into the upper electrode, the RF energy may couple with the released reactant gas to ignite and sustain a plasma in the plasma generation region for substrate processing.

In some plasma processing systems, the upper electrode may alternatively or additionally be energized with RF energy. The RF signal applied to the upper electrode may have the same or a different. RF frequency relative to the RF frequency of the RF signal supplied to the lower electrode.

One challenge confronting designers of plasma processing systems is the need to confine the plasma to the plasma generation region at all times and especially during plasma processing. In plasma processing chambers where the upper electrode is energized with RF energy, the need to confine plasma is particularly acute.

This is because when the upper electrode is energized with RF energy, an electric field is set up between grounded chamber components and the RF-energized upper electrode. This electric field may cause unwanted ignition of plasma from reactant gases in the gas feed passages which, as previously mentioned, are employed to provide reactant gases to the plasma generation region.

To elaborate on this phenomenon, it should be noted that the chamber walls and many portions of a typical plasma processing chamber are typically grounded for safety reasons, among others. When the upper electrode is provided with RF power, an electric field exists between the RF-powered upper electrode and the grounded chamber components above it. Reactant gases flowing in gas passages or tubes that traverse this electric field may be sufficiently excited to form a plasma inside the gas passages or in interstitial volumes between upper electrode layers and parts. This plasma is unintended and undesirable since its presence introduces unpredictability to the process and thus is often detrimental to the etch result. Furthermore, the unwanted plasma often accelerates upper electrode component erosion, leading to premature upper electrode or plasma processing system failure.

Controlling this undesirable plasma formation is one of any goals of embodiments of the present invention.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Embodiments of the invention relate to an improved gas feed insert configured to be disposed in a passage through an electrode assembly, such as an upper electrode assembly although the invention may also be applied to other electrode assemblies, such as the lower electrode assembly or an auxiliary electrode assembly. The improved gas feed insert has, in one or more embodiments, a first insert end opposite the second insert, end. In each of the insert ends, there is disposed a bore to facilitate gas flow. The bores are disposed parallel to the linear axis of the insert. In an embodiment, one or both of the bores may be axially aligned with the linear axis of the insert.

The bores in the two ends of the insert do not meet one another. Instead, each bore is coupled with a respective cross channel that is also coupled to a bore-to-bore communication channel disposed on the external surface of the insert. In one or more embodiments, the cross channel is orthogonal or at an angle relative to the bore through the end of the insert. In one or more embodiments, the bore-to-bore communication channel is a spiral built into the external surface of the insert. In this manner, an end-to-end gas channel is created through the insert from the first insert end to the second insert end via the two cross channels and the bore-to-bore communication channel.

In one or more embodiments, the bore diameter, the cross-channel diameter and/or the bore-to-bore channel diameter is/are kept small in order to prevent plasma formation in these bores and channels. Further, since the bores, cross-channel, and bore-to-bore channel are not physically aligned, the plasma does not have a line-of-sight to other components of the chamber through the gas feed insert.

In one or more embodiments, the electrode assembly is a multi-layer electrode assembly, and the gas feed insert has at least two different outer diameters or circumferences to better protect the various layers of the multi-layer electrode assembly from line-of-sight plasma exposure.

The features and advantages of embodiments of the invention may be better understood with reference to the figures and discussions that follow.

Figure 1:
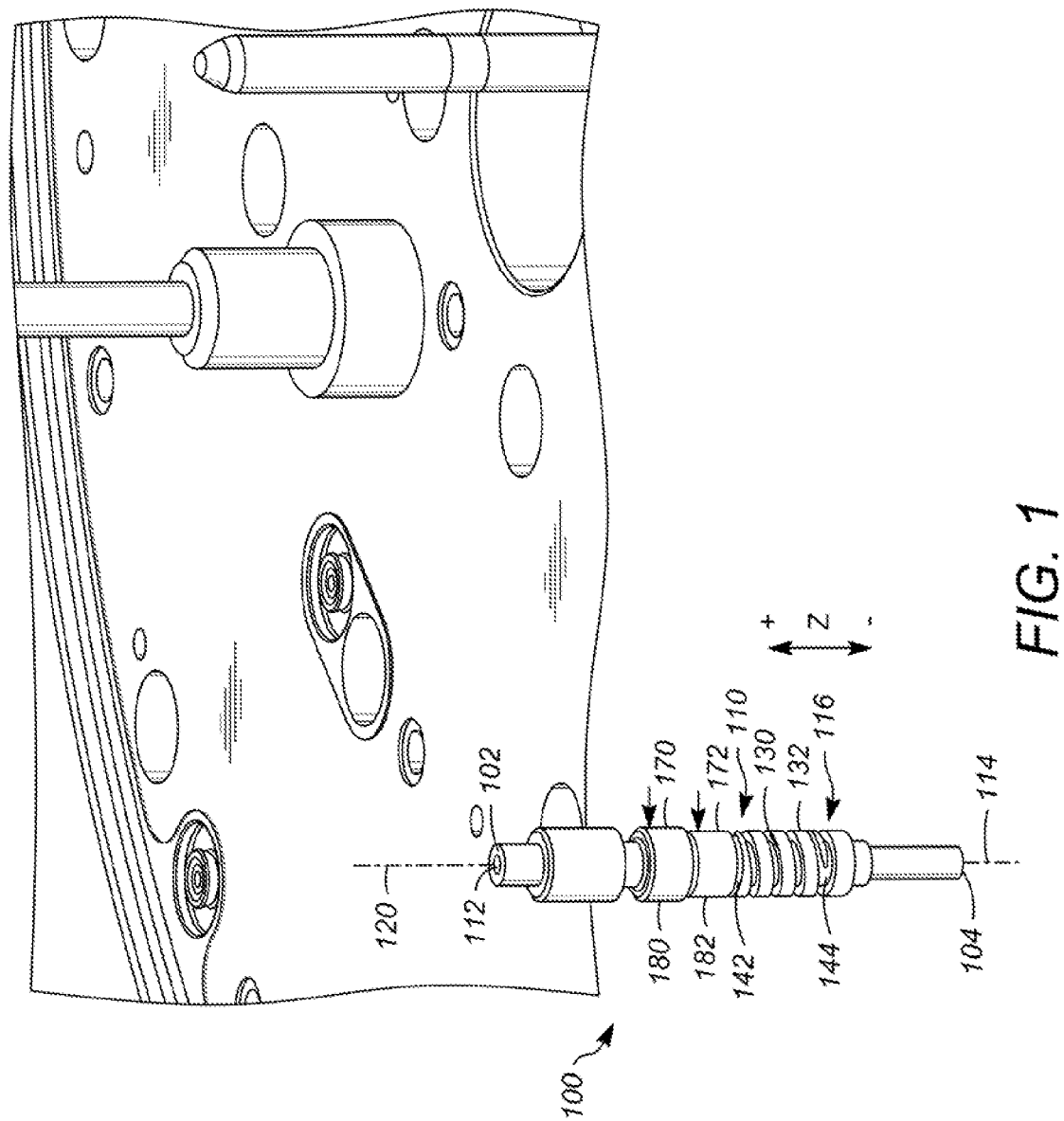
FIG. 1 shows, in accordance with an embodiment of the invention, a simplified drawing of a gas feed insert.

FIG. 1 shows, in accordance with an embodiment of the invention, a simplified drawing of a gas feed insert 100, including a first insert end 102 and a second insert end 104 opposite the first insert end. Insert end 102 has a bore 112 extending from the insert opening partially through gas feed insert 100 and aligned with linear axis 120 of gas feed insert 100 such that the bottom of bore 112 is at the location indicate by arrow 110. Likewise, insert end 104 has a bore 114 extending from the insert opening partially through gas feed insert 100 and aligned with linear axis 120 of simplified gas feed insert 100 such that the bottom of bore 114 is at the location indicate by arrow 116.

A bore-to-bore channel 130 is formed on the external surface 132 of gas feed insert 100. In a preferred embodiment, bore-to-bore channel 130 is a spiral formed on external surface 132 although bore-to-bore channel 130 may simply be a straight channel if desired. Cross channels 142 and 144 are employed to couple bores 112 and 114 respectively to bore-to-bore channel 130. When gas feed insert 100 is disposed in a hole through an electrode and fits snugly or even loosely therein, the gas entering bore 112 at first insert end 102 would traverse bore 112, cross channel 142, bore-to-bore 130, cross channel 144, and bore 114 to exit at second insert end 104.

The spiral form has the advantage of increasing the distance traveled by the gas from the ground potential existing at one end of the gas feed insert and the RF potential existing at the other end of the gas feed insert (or vice versa) when RF energy is supplied to the electrode. However, such spiral form is not an absolute requirement since the use of a bore-to-bore channel (such as 130) that is not line-of-sight with bores 102 and 104 already offer advantages with respect to preventing damage from the plasma to components along the gas flow path and components disposed behind the electrode.

In a preferred embodiment, the cross-section of each of bore 112, cross channel 142, bore-to-bore 130, cross channel 144, and bore 114 is sized so that the cross-section dimension is smaller than what is necessary to ignite and/or sustain the plasma in those components. One skilled in the art will readily appreciate that such cross-section dimension calculation is within the skills of one skilled in the art in the plasma field (based on, for example Paschen's Law) and will vary from chamber to chamber depending on for example, the threshold voltage required to ignite a gas discharge at a given pressure and/or other parameters (e.g., type of reactant gases, the RF power supplied, the RF frequency, etc.).

In one or more embodiments, only some but not every one of bore 112, cross channel 142, bore-to-bore 130, cross channel 144, and bore 114 are sized so that the cross-section dimension is smaller than what is necessary to ignite and/or sustain the plasma in those components.

In the embodiment of FIG. 1, portion 170 has an outer diameter 180 and portion 172 had an outer diameter 182 that is smaller than outer diameter 180. When gas feed insert 100 is disposed into a hole in the electrode by inserting, gas feed insert 100 in the direction +Z to −Z direction, the portion 170 having larger outer diameter 180 stops on a smaller hole that is designed to accommodate portion 172, thereby positioning gas feed insert 100 in the Z direction within the electrode. Further, when viewed along the −Z to +Z direction, electrode material adjacent to portion 170 is not exposed in a line-of-sight manner along the outer surface of gas feed insert 100. This is because the larger diameter 180 of portion 170 requires that the hole portion of the electrode that accommodates portion 170 of gas feed insert 100 be larger than the hole portion of the electrode that accommodates portion 172 of gas feed insert 100. Thus the electrode material adjacent to portion 170 would be essentially recessed away from the gas feed insert axis, rendering such electrode material adjacent to portion 170 more protected from the plasma that may be present below second insert end 104 or seeping, up along the outer surface of the insert. Although FIG. 1 shows only one such "recessed" feature to protect the electrode material adjacent thereto, multiple gas feed insert portions with various outer diameter sizes may be provided to protect various portions of the electrode if desired.

Figure 2:
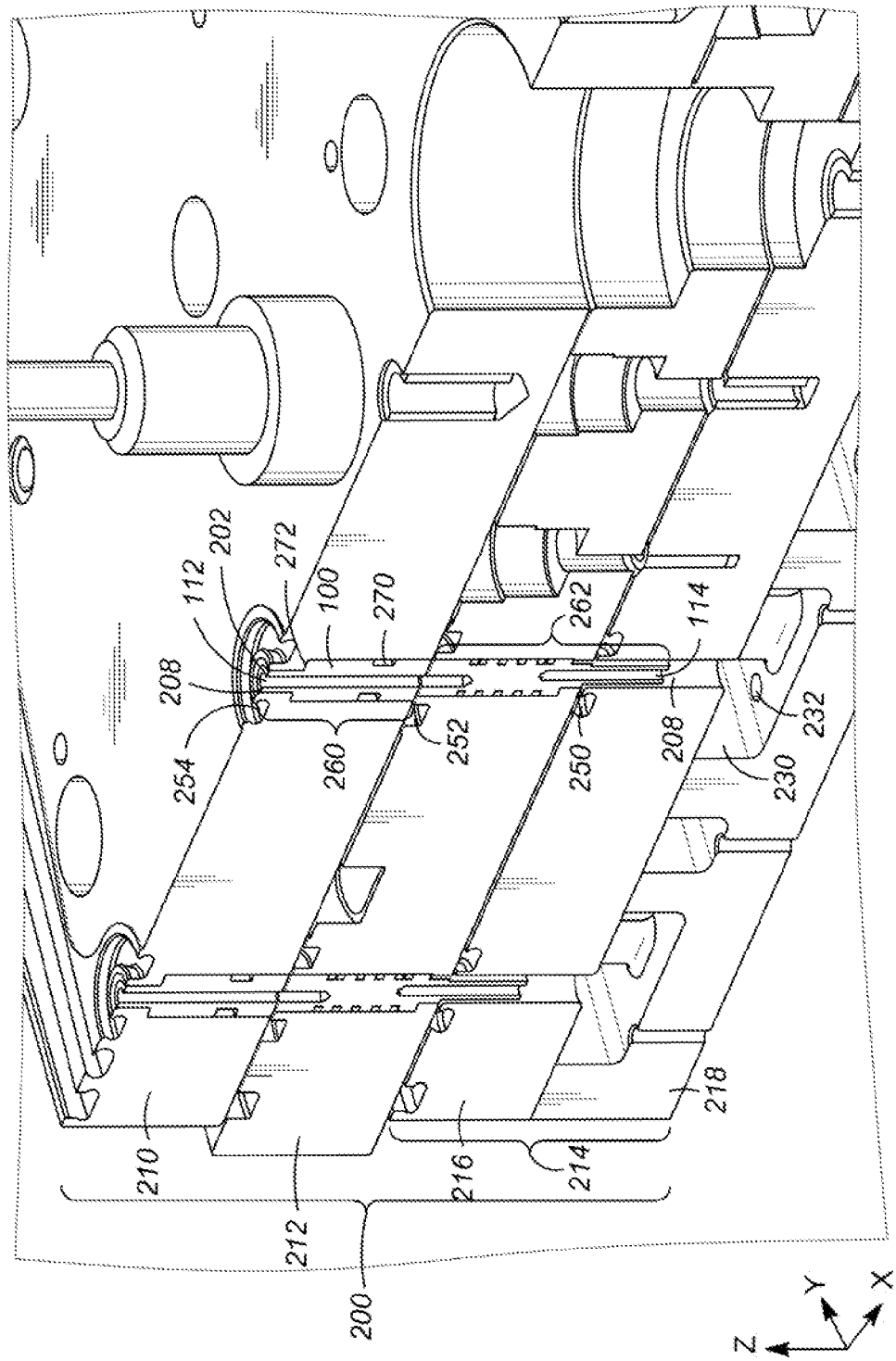
FIG. 2 shows, in accordance with embodiments of the invention, a simplified cut-away drawing of gas feed insert through an upper electrode in an example capacitively coupled plasma processing chamber.

FIG. 2 shows, in accordance with embodiments of the invention, a simplified cut-away drawing of gas feed insert 100 through an upper electrode in an example capacitively coupled plasma processing chamber. Although a capacitively coupled plasma processing chamber is illustrated, it should be kept in mind that the invention is equally applicable to chambers employing inductively coupled plasma, electron-cyclotron technology, microwave technology, etc.

In FIG. 2, gas feed insert 100 is shown disposed in a hole 208 that is created through the layers of an electrode assembly 200. In the case of the example of FIG. 2, electrode assembly 200 is an upper electrode although embodiments of the invention apply equally well to other electrodes such as the lower electrode, auxiliary electrodes, etc. In the example of FIG. 2, electrode assembly 200 includes a heater plate 210, typically made of aluminum or another suitable material and may include liquid channels for heating/cooling fluid circulation and/or resistive heating elements. In an example chamber, heater plate 210 may be grounded.

An electrically insulating layer 212, formed of aluminum nitride or another suitable insulating, material, is shown disposed between grounded heater plate 210 and a gas distribution plate 214 comprising two layers 216 and 218 as shown. Layers 216 and 218 are typically formed of aluminum or another suitable material. Gas distribution plate 214 may include gas manifolds 230 and gas diffusion holes 232 for distributing the gas received via gas feed insert 100 that is disposed in hole 208 to the region below gas distribution plate 214 for plasma generation. Although not shown in the example of FIG. 2, there may be disposed below gas distribution plate 214 a silicon layer also having therein gas diffusion holes. The silicon layer or plate and/or gas distribution plate 214 may be RF-hot (i.e., one or both may be supplied with RF energy). As can be appreciated from FIG. 2, an electric field is set up by the potential difference between grounded heater plate 210 and RF-hot gas distribution plate 214 and may ignite gas in hole 208 if an appropriately designed insert is not provided.

The use of the gas insert substantially simplifies manufacturing, maintenance, and replacement of parts in electrode assembly 200. It would have been very difficult and expensive to mill or machine out the appropriately sized offset gas paths in each of holes 208 of electrode assembly 200. Instead, embodiments of the invention simply require that holes be created through electrode assembly 200 and the inserts perform the job of preventing unwanted plasma formation in the holes and preventing line-of-sight plasma-related damage to components of electrode assembly 200 or to components disposed above electrode assembly 200. The inserts themselves can be individually formed inexpensively and independent of the manufacturing of the larger, more cumbersome and more expensive electrode assembly. If any one of the inserts is found to be defective or malfunctions, that insert can be swapped out instead of having to swap out the entire electrode assembly as would be the case if the offset gas paths are integrated into the electrode assembly itself. If different reactant gases, different RF power regimes, different RF frequencies are employed and the cross-section of the gas passages need to be changed to a smaller cross-section to prevent unwanted plasma formation in the gas passages, the inserts can be simply swapped out.

In the example of FIGS. 1 and 2, the gas feed inserts are formed of a suitable ceramic such as alumina. However, other suitable materials such as quartz or plastic may also be employed. In an example, the cross-sectional dimension of the gas passages in the gas feed insert is about 0.062 inch.

In FIG. 2, resilient o-rings or gaskets 250, 252, and 254 are provided to prevent any gas that escapes hole 208 from seeping into interstitial cracks or regions between sub-components of the electrode assembly 200. To aide in the manufacturing and/or assembly, the gas feed insert may be formed in different sections (such as two sections 260 and 262 as shown in FIG. 2) or in 3 or 4 or more sections if desired. To assist in the assembly and/or alignment process, concentric O-rings may be provided in the electrode assembly body to help retain the gas feed insert section(s) in place and/or to center the gas feed insert section(s) in the electrode assembly hole when the electrode assembly is assembled with the gas feed insert.

For example, concentric O-ring 270 formed of a resilient material may be employed to retain gas feed insert section 260 in place and centered with respect to the hole in which it is fitted. A shoulder 272 may be employed to simplify assembly by automatically aligning gas feed insert section 260 in the Z direction in heater plate 210 when gas feed insert section 260 is inserted into the hole in heater plate 210 from below prior to mating heater plate 210 and insulating, layer 212 together. By using a combination of shoulder 272 and concentric O-ring 270, assembly may be substantially simplified since gas feed insert section 260 is automatically aligned axially with respect to the hole by the concentric O-ring and aligned in the Z direction by the operation of shoulder 272 which rests on a complimentary shelf built into the material of the electrode body.

As can be seen in FIG. 2, reactant gas that enters bore 112 at first end 202 traverses from a region of grounded RF potential (since heater plate 210 is typically grounded) to an RF-hot region in the vicinity of the opening of bore 114 (since the gas distribution plate 214 is typically RF-hot). By forcing, the gas to take a longer path via the cross channel and/or the non line-of-sight spiral, the gas molecules take a long path through the electric, field, which reduces the tendency to ignite. Also as can be seen in FIG. 2, the gas feed insert needs not span the entire thickness of the electrode assembly to be effective since the non line-of-sight advantage is retained irrespective of the length of the insert. In embodiments of the invention, the non line-of-sight advantage is obtained, in part, by offsetting the bore and connecting them with cross-channels and optionally the bore-to-bore channel(s) disposed on the external surface of the gas feed insert. Further, the length of each bore and/or the spiral and/or the bore-to-bore channel may vary as desired depending on chambers.

Figure 3:
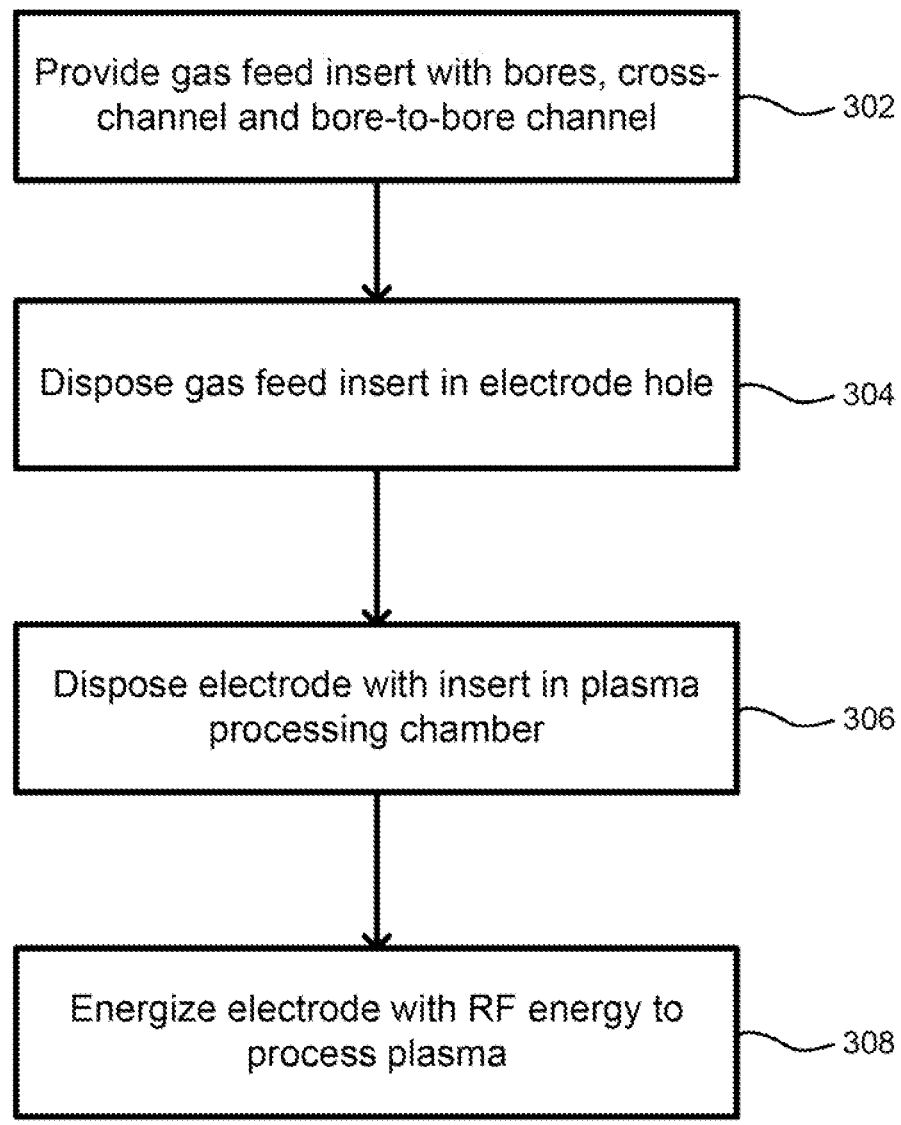
FIG. 3 shows, in accordance with embodiments of the invention, a method for implementing the gas feed insert of embodiments of the invention.

FIG. 3 shows, in accordance with embodiments of the invention, a method for implementing the gas feed insert of embodiments of the invention. In step 302, a gas feed insert having two bores created partially through the length of the insert and disposed parallel to or aligned with or centered with the linear axis of the gas feed insert is provided. The gas feed insert further has cross channels to connect these linear bores with a bore-to-bore channel disposed on the outer surface of the gas feed insert. The gas feed insert may optionally have different sections with different outer diameters to protect various portions of the electrode as discussed earlier.

In step 304, the gas feed insert is disposed a hole in an electrode of the plasma processing chamber. If the gas feed insert is formed of different sections, different sections of the gas feed insert may be disposed in different layers or sections of the electrode prior to assembling the electrode assembly together as one part. In step 306, the electrode having therein the gas feed insert is disposed in a plasma processing chamber. In step 308, the electrode is energized with RF energy for processing one or more substrates in the chamber while reactant gas is flowed through the gas feed inserts and provided to a plasma generation region of the plasma processing chamber to generate plasma to process a substrate.

As can be appreciated from the foregoing, embodiments of the invention advantageously prevent line-of-sight plasma-related, damage to components of the electrode and/or components near or behind the electrode. Further, embodiments of the invention prevent unwanted plasma formation in the gas feed channels using methods and apparatus that are simple, efficient, and cost-effective to implement, manufacture, maintain, and/or replace.

While this invention has been described in terms of several preferred embodiments, there are alterations, permutations, and equivalents, which fall within the scope of this invention. Although various examples are provided herein, it is intended that these examples be illustrative and not limiting with respect to the invention. Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A gas feed insert configured to be disposed in a passage through an electrode assembly, comprising
   a first insert end having therein a first bore aligned parallel with a linear axis of said gas feed insert;
   a second insert end opposite said first insert end, said second insert end having therein a second bore aligned parallel with said linear axis of said gas feed insert; and
   a bore-to-bore communication channel in gas flow communication with said first bore and said second bore, said bore-to-bore communication channel being formed in an outer surface of said gas feed insert so as to prevent a line-of-sight when a gas flows from said first insert end through said bore-to-bore communication to said second insert end, wherein at least a part of the insert is integrally formed, and wherein the first bore, the boreto-bore communication channel, and at least a part of the second bore are created within said part that is integrally formed.

2. The gas feed insert of claim 1 wherein said gas communication channel wherein said bore-to-bore communication channel is a spiral channel created in an external surface of said gas feed insert.

3. The gas feed insert of claim 1 wherein said electrode represents a multi-layer electrode and wherein said gas feed insert has at least two different cylindrical shaped portions, each portion with a different outer diameter, and each portion configured to fit adjacent to a cylindrical hole in a separate layer of the multi-layer electrode.

4. The gas feed insert of claim 1 further comprising at least one cross channel coupling with said first bore and said bore-to-bore communication.

5. The gas feed insert of claim 4 wherein said at least one cross channel is disposed orthogonal to said first bore.

6. The gas feed insert of claim 4 wherein said at least one cross channel is disposed at an angle other than parallel to said first bore.

7. The gas feed insert of claim 4 wherein said at least one cross channel is also coupled to said second bore.

8. The gas feed insert of claim 1 wherein a cross-section dimension of said first bore is insufficient large to sustain a plasma in said first bore when RF power is provided to at least a portion of said electrode assembly.

9. The gas feed insert of claim 1 further comprising at least one shoulder built into an external surface of said gas feed insert to facilitate aligning said gas feed insert in a Z direction when said gas feed insert is assembled in said passage of said electrode assembly.

10. The gas feed insert of claim 1 wherein said gas feed insert is formed from at least two physically separate sections prior to assembly, said first bore is disposed in a first section, and at least a portion of said second bore is disposed at least in part in a second section.

11. A method for manufacturing a plasma processing system having at least one plasma processing chamber, said plasma processing chamber including an electrode assembly, said method comprising:
  providing a gas feed insert, said gas feed insert having at least
    a first insert end having therein a first bore aligned parallel with a linear axis of said gas feed insert,
    a second insert end opposite said first insert end, said second insert end having therein a second bore aligned parallel with said linear axis of said gas feed insert, and
    a bore-to-bore communication channel in gas flow communication with said first bore and said second bore, said bore-to-bore communication channel being formed in an outer surface of said gas feed insert so as to prevent a line-of-sight when a gas flows from said first insert end through said bore-to-bore communication to said second insert end, wherein at least a part of the insert is integrally formed, and wherein the first bore, the bore-to-bore communication channel, and at least a part of the second bore are created within said part that is integrally formed;
  disposing said gas feed insert in a hole in said electrode assembly; and
  assembling said electrode in said plasma processing chamber.

12. The method of claim 11 wherein said gas communication channel wherein said bore-to-bore communication channel is a spiral channel created in an external surface of said gas feed insert.

13. The method of claim 11 wherein said electrode represents a multi-layer electrode and wherein said gas feed insert has at least two different cylindrical shaped portions, each portion with a different outer diameter, and each portion configured to fit adjacent to a cylindrical hole in a separate layer of the multi-layer electrode.

14. The method of claim 11 wherein said gas feed insert further comprises at least one cross channel coupling with said first bore and said bore-to-bore communication.

15. The method of claim 14 wherein said at least one cross channel is disposed orthogonal to said first bore.

16. The method of claim 14 wherein said at least one cross channel is also coupled to said second bore.

17. The method of claim 11 wherein a cross-section dimension of said first bore is insufficient large to sustain a plasma in said first bore when RF power is provided to at least a portion of said electrode assembly.

18. The method of claim 11 wherein said gas feed insert is formed from at least two physically separate sections prior to assembly, said first bore is disposed in a first section, and at least a portion of said second bore is disposed at least in part in a second section.

19. A plasma processing system comprising at least one plasma processing chamber, said plasma processing chamber including:
  an electrode; and
  a gas feed insert configured to be disposed in a passage through said electrode assembly, comprising
    a first insert end having therein a first bore aligned parallel with a linear axis of said gas feed insert,
    a second insert end opposite said first insert end, said second insert end having therein a second bore aligned parallel with said linear axis of said gas feed insert, and
    a bore-to-bore communication channel in gas flow communication with said first bore and said second bore, said bore-to-bore communication channel being formed in an outer surface of said gas feed insert so as to prevent a line-of-sight when a gas flows from said bore through said bore-to-bore communication to said bore, wherein at least a part of the insert is integrally formed, and wherein the first bore, the bore-to-bore communication channel, and at least a part of the second bore are created within said part that is integrally formed.

20. The plasma processing system of claim 19 wherein said gas communication channel wherein said bore-to-bore communication channel is a spiral channel created in an external surface of said gas feed insert.

21. The plasma processing system of claim 19 wherein said electrode represents a multi-layer electrode and wherein said gas feed insert has at least two different cylindrical shaped portions, each portion with a different outer diameter, and each portion configured to fit adjacent to a cylindrical hole in a separate layer of the multi-layer electrode.

* * * * *

UNITED STATES PATENT AND TRADEMARK OFFICE
CERTIFICATE OF CORRECTION

| | | |
|---|---|---|
| PATENT NO. | : 9,111,731 B2 | Page 1 of 1 |
| APPLICATION NO. | : 13/616571 | |
| DATED | : August 18, 2015 | |
| INVENTOR(S) | : de la Llera et al. | |

It is certified that error appears in the above-identified patent and that said Letters Patent is hereby corrected as shown below:

In the Claims

Claim 2 (column 7, line 4-5) change "The gas feed insert of claim 1 wherein said gas communication channel wherein said bore-to-bore communication" to -- The gas feed insert of claim 1 wherein said bore-to-bore communication --

Claim 8 (column 7, line 25) delete "large"

Claim 12 (column 8, line 3-4) change "The method of claim 11 wherein said gas communication channel wherein said bore-to-bore communication" to -- The method of claim 11 wherein said bore-to-bore communication --

Claim 17 (column 8, line 21) delete "large"

Claim 19 (column 8, line 46-47) change "bore through said bore-to-bore communication to said bore, wherein at least a part of the insert is" to -- first bore through said bore-to-bore communication to said second bore, wherein at least part of the insert is --

Claim 20 (column 8, line 52-53) change "The plasma processing system of claim 19 wherein said gas communication channel wherein said bore-to-bore" to -- The plasma processing system of claim 19 wherein said bore-to-bore --

Signed and Sealed this
Third Day of May, 2016

Michelle K. Lee
*Director of the United States Patent and Trademark Office*